(12) United States Patent
Matsubara et al.

(10) Patent No.: US 11,687,261 B2
(45) Date of Patent: *Jun. 27, 2023

(54) SEMICONDUCTOR DEVICE AND A METHOD FOR CONTROLLING ACCESSING DATA

(71) Applicant: RENESAS ELECTRONICS CORPORATION, Tokyo (JP)

(72) Inventors: Katsushige Matsubara, Tokyo (JP); Seiji Mochizuki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/517,929

(22) Filed: Nov. 3, 2021

(65) Prior Publication Data

US 2022/0057950 A1    Feb. 24, 2022

Related U.S. Application Data

(63) Continuation of application No. 16/683,934, filed on Nov. 14, 2019, now Pat. No. 11,194,491.

(30) Foreign Application Priority Data

Dec. 25, 2018   (JP) ................................ 2018-241052

(51) Int. Cl.
    *G06F 3/06*    (2006.01)
(52) U.S. Cl.
    CPC ............ *G06F 3/0638* (2013.01); *G06F 3/061* (2013.01); *G06F 3/0656* (2013.01); *G06F 3/0679* (2013.01)
(58) Field of Classification Search
    CPC ...... G06F 3/061; G06F 3/0638; G06F 3/0656; G06F 3/0679; H03M 7/30; H03M 7/6029
    (Continued)

(56) References Cited

U.S. PATENT DOCUMENTS 9,235,590 B1 * 1/2016 Wang ................... H03M 7/6064
2002/0054218 A1 * 5/2002 Kobayashi ........... H04N 1/2112
                                                        348/220.1

(Continued)

FOREIGN PATENT DOCUMENTS

| JP | 10-27127 A    | 1/1998 |
| JP | 2011-34370 A  | 2/2011 |
| JP | 2017-102524 A | 6/2017 |

OTHER PUBLICATIONS

Japanese Notice of Reasons for Refusal issued in corresponding Japanese Patent Application No. 2018-241052, dated Mar. 15, 2022, with English translation.

(Continued)

*Primary Examiner* — Hashem Farrokh
(74) *Attorney, Agent, or Firm* — McDermott Will & Emery LLP

(57) ABSTRACT

A semiconductor device for achieving consistency of data is provided. The process performed by the semiconductor device includes a step of compressing data to generate compression information representing compressed data and the amount of information, a step of accessing management data for controlling access to a memory area, a step of permitting writing to a memory area in units of a predetermined data size based on the fact that the management data indicates that the accessed area is not exclusively allocated to another compression/expansion module, a step of writing data to update management data, a step of permitting reading from the area in units of the data size based on the fact that the management data indicates that the accessed area is not exclusively owned to another compression/expansion module, and a step of reading the compressed data and the compressed information from the area in units of the data size.

12 Claims, 12 Drawing Sheets

(58) Field of Classification Search
USPC .......................................................... 711/102
See application file for complete search history.

(56) References Cited

U.S. PATENT DOCUMENTS

2017/0116142 A1* 4/2017 Abali .................... G06F 3/0632
2017/0153838 A1 6/2017 Matsubara et al.

OTHER PUBLICATIONS

U S. PTO Non-Final Office Action issued in related parent U.S. Appl. No. 16/683,934, dated Mar. 10, 2021.
U.S. PTO Notice of Allowance issued in related parent U.S. Appl. No. 16/683,934, dated Aug. 9, 2021.
U.S. Appl. No. 16/683,934, filed Nov. 14, 2019.

* cited by examiner

SEMICONDUCTOR DEVICE AND A METHOD FOR CONTROLLING ACCESSING DATA

CROSS-REFERENCE TO RELATED APPLICATIONS

This is a Continuation of U.S. patent application Ser. No. 16/683,934 filed on Nov. 14, 2019, which claims the benefit of Japanese Patent Application No. 2018-241052 filed on Dec. 25, 2018 including the specification, drawings and abstract are incorporated herein by reference in their entirety.

BACKGROUND

The present disclosure relates to semiconductor device and, illustratively, to exclusive control of accesses of data in semiconductor device.

With respect to data processing in semiconductor device, as the processing by each module is advanced, the required memory bandwidth is increased. In order to cope with this, Japanese Unexamined Patent Application Publication No. 10-27127 (Patent Document 1), for example, discloses a technique of "compressing data and storing it in a storage device, expanding it at the time of operation, and using it", and a technique of "reducing the amount of data transferred between a storage device and an arithmetic unit and improving the process rate of a computer". The art is as follows: "A data compression circuit 5 and a expansion circuit 6 are provided between the arithmetic unit 1 and the bus control circuit 4 for writing the arithmetic result to the storage device, and the arithmetic result is compressed and the input data from the storage device is decompressed. The compressed data is stored in the physical address 8 obtained by converting the logical address 7 obtained by the address generator 2 by the paging control circuit 3. In the paging conversion process, the information of the compression method is stored in the page table. When the compressed data from the storage device is referred, the expansion process is performed based on the information in the page table, and the arithmetic unit 1 performs the arithmetic operation."

Japanese Unexamined Patent Application Publication No. 2017-102524 (Patent Document 2) discloses "a semiconductor device capable of performing compression and expansion more appropriately". The semiconductor device includes: "The semiconductor device 100 includes an arithmetic module 110 and a memory control module 120; the arithmetic module 110 includes an arithmetic unit 111 that executes arithmetic processing; and a compression circuit 11 that compresses data resulting from the arithmetic processing; the memory control module 120 includes an access circuit 121 that writes the compressed data to the memory and reads the written data from the memory; and an expansion circuit 21 that expands data read from the memory and outputs the expanded data to the arithmetic module 110 (see [ABSTRACT])."

SUMMARY

According to the technique disclosed in Patent Document 2, in order to efficiently compress data, the arithmetic module includes a buffer. The buffer holds the data until the of data required for compression is accumulated. When the of data in the buffer is less than the required for compression at the time when the arithmetic module finishes processing, the terminal data continues to remain in the buffer. For example, when the processing result of one signal processing module is used by another signal processing module, the other signal processing module cannot use the data having the correct end, and thus the consistency of the data is not realized.

Further, when the lossless compression method is used, since the amount of data after compression is variable, information indicating the amount of data after compression (hereinafter also referred to as "compression information") exists for each unit of data amount required for compression. Since the buffer for storing the compressed information also exists in the processing module for performing the compression/expansion, the compressed information corresponding to the data at the end continues to remain in the buffer.

Accordingly, there is a need for a technique that ensures data consistency even when lossless compression and expansion is performed. There is also a need for a technique that ensures data consistency without changing the configuration of a signal processing module or a module that performs compression/expansion, or incorporating control for checking the timing of data input/output between modules. In yet another aspect, there is a need for a technique that enables extrusion of a buffer even in the case of processing in which the processing unit of a signal processing module is not clear, that is, in the case where the end of processing at the timing of extrusion of data from the buffer is not clear.

The present disclosure has been made in view of the above-described background, and in some aspects, a technique is disclosed in which data consistency is ensured even when lossless compression processing is performed.

Means of Solving the Problems

The semiconductor device according to an embodiment comprises a first compression/expansion module for compressing or expanding data, a second compression/expansion module for compressing or expanding data, a memory for storing the compressed data generated by the first compression/expansion module or the compressed data generated by the second compression/expansion module, and a managing module for exclusively controlling accesses to the memory by the first compression/expansion module and the second compression/expansion module in units of defined data sizes. The first compression/expansion module includes: a lossless compression processing unit for compressing data and outputting compressed data and compression information indicating a data amount of the compressed data; a lossless expansion processing unit for expanding the compressed data and outputting data before compression; and a compression information management unit for controlling writing or reading of the compressed data in the memory in units of a predetermined data size based on data for managing access. When a write access to the memory is performed, the compression information management unit permits writing to the region in a predetermined data size unit when the management module indicates that the area accessed by the write access is not occupied by another compression/expansion module, and when a lead access to the memory is performed, allows reading from the area in a predetermined data size unit when the management module indicates that the area accessed by the read access is not occupied by another compression/expansion module.

In some aspects, data consistency is ensured even when lossless compression processing is performed.

Other objects and novel features will become apparent from the description of this specification and the accompanying drawings.

DETAILED DESCRIPTION

Figure 1:
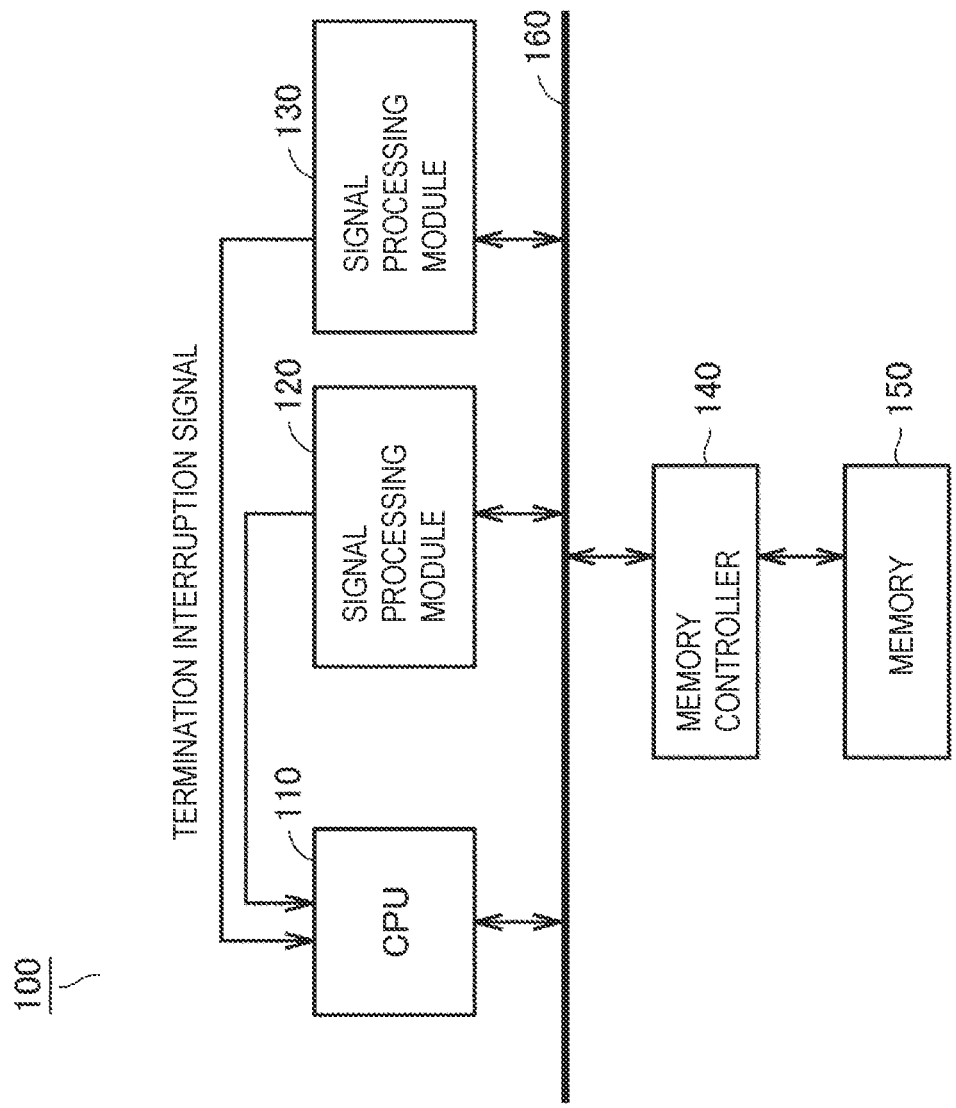
FIG. 1 shows an exemplary semiconductor device 100 in which two signal processing modules share a memory area.

Embodiments according to the technical idea disclosed in this specification will be described below with reference to the drawings. In the following description, the same components are denoted by the same reference numerals. Their names and functions are also the same. Therefore, detailed description thereof will not be repeated.

Figure 2:
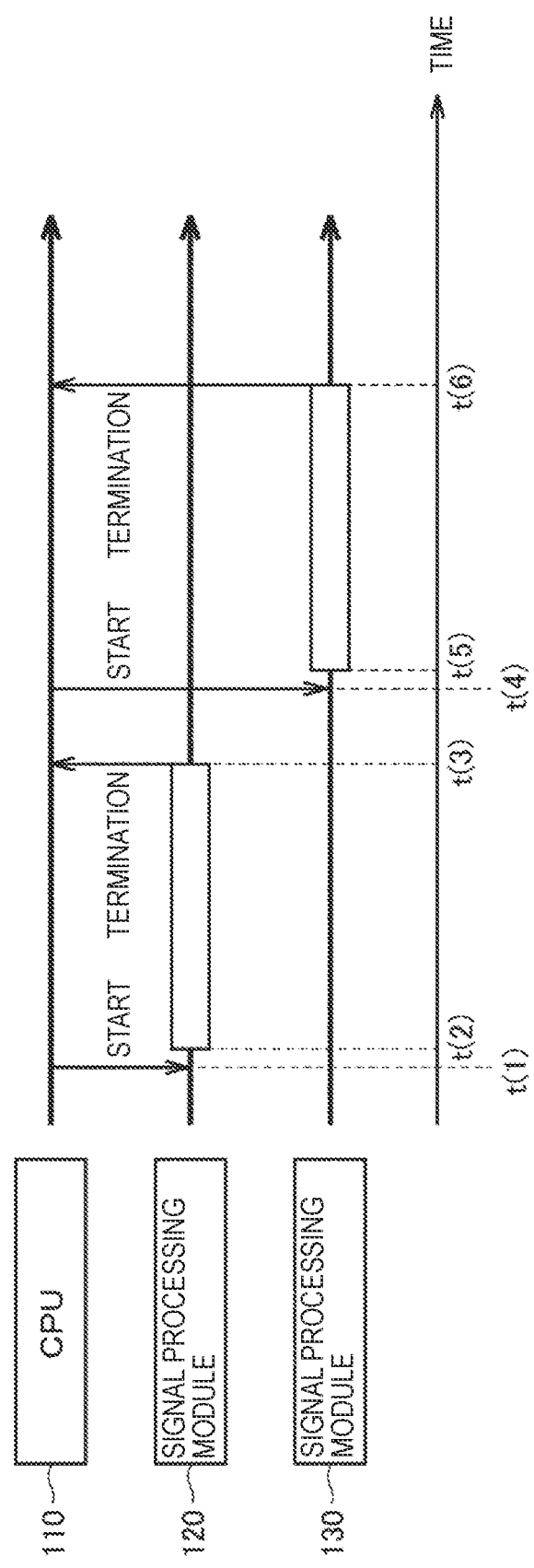
FIG. 2 shows a flow chart describing the timing of controls implemented to achieve consistency in the two signal processing modules.

Referring to FIGS. 1 and 2, a memory architecture in accordance with an aspect will be described. FIG. 1 shows an exemplary semiconductor device 100 in which two signal processing modules share a memory area. FIG. 2 shows a flow chart describing the timing of controls implemented to achieve consistency in the two signal processing modules.

As shown in FIG. 1, the semiconductor device 100 includes a CPU (Central Processing Unit) 110, signal processing modules 120 and 130, a memory controller 140, and a memory 150. The CPU110, the signal processing modules 120 and 130, and the memory controller 140 are connected to buses 160, respectively. The memory 150 is connected to the memory controller 140. Memories 150 are, for example, DDR (Double Data Rate)-SDRAM (Synchronous Dynamic Random Access Memory), but are not limited to this.

As shown in FIG. 2, at time t(1), the CPU110 transmits an instruction to execute processing to the signal processing module 120. In response to the execution instruction, the signal processing module 120 starts execution of processing at timing t(2). When the signal processing module 120 confirms that a certain processing unit has been completed and all data has been stored in the memory 150, it notifies the CPU110 that the processing has been completed as a termination interruption at time t(3). Thereafter, at time t(4), the CPU110 transmits an instruction to execute processing to the signal processing module 130. In response to the execution instruction, the signal processing module 130 starts execution of processing at timing t(5). When the signal processing module 130 confirms that a certain processing unit has been completed and all data has been stored in the memory 150, at time t(6), it notifies the CPU110 that the processing has been completed as a termination break.

In some aspects, the sum of the frequency bands of memory required by each signal processing module may exceed the bandwidths of memory 150. Therefore, it is conceivable to compress the data. As data compression, a compression/expansion module (CEM: Compression/Expansion Module) may be provided in a data input/output unit of each signal processing module. In order to efficiently compress data, it is necessary to process data in units of a certain amount of data, and the CEM has a buffer.

Figure 3:
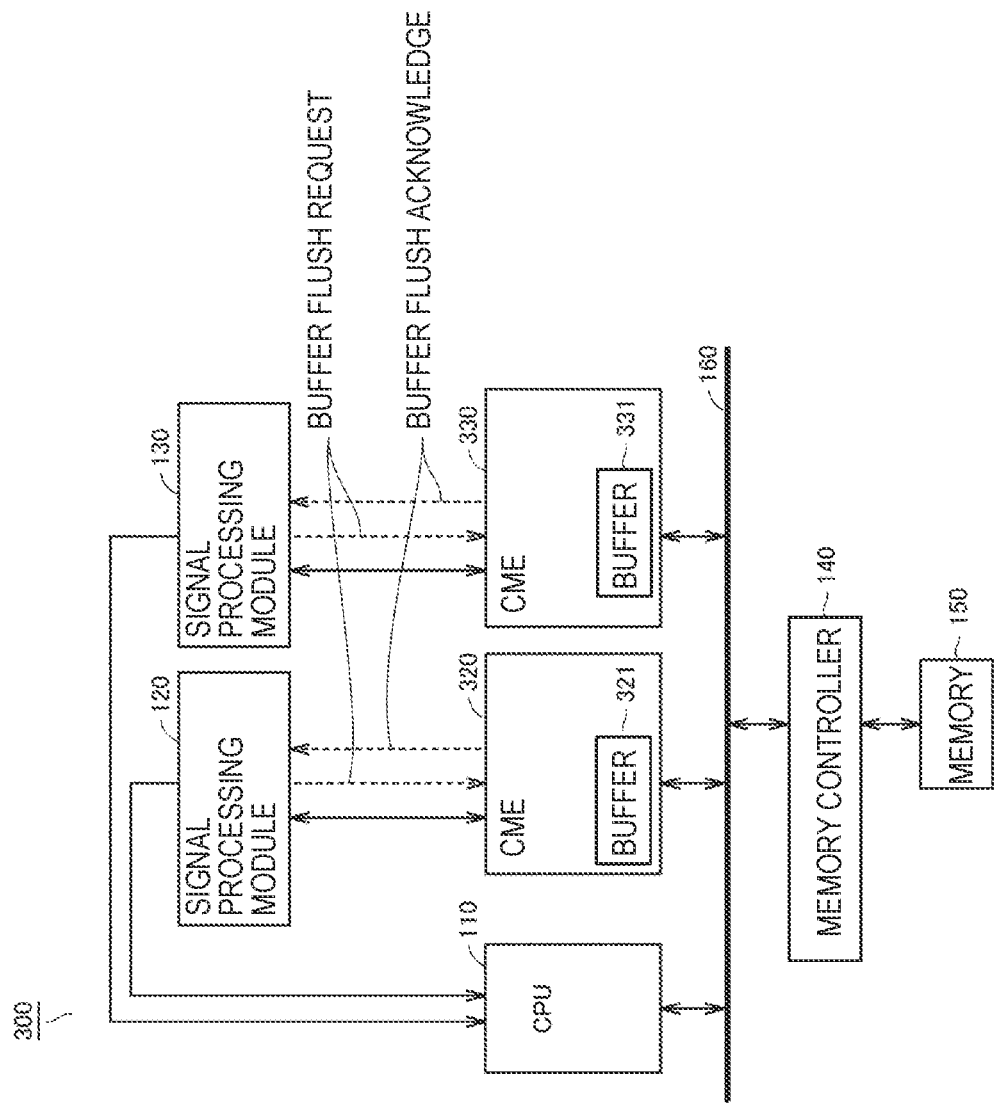
FIG. 3 shows a block diagram describing the hardware structure of the semiconductor device 300.
Figure 4:
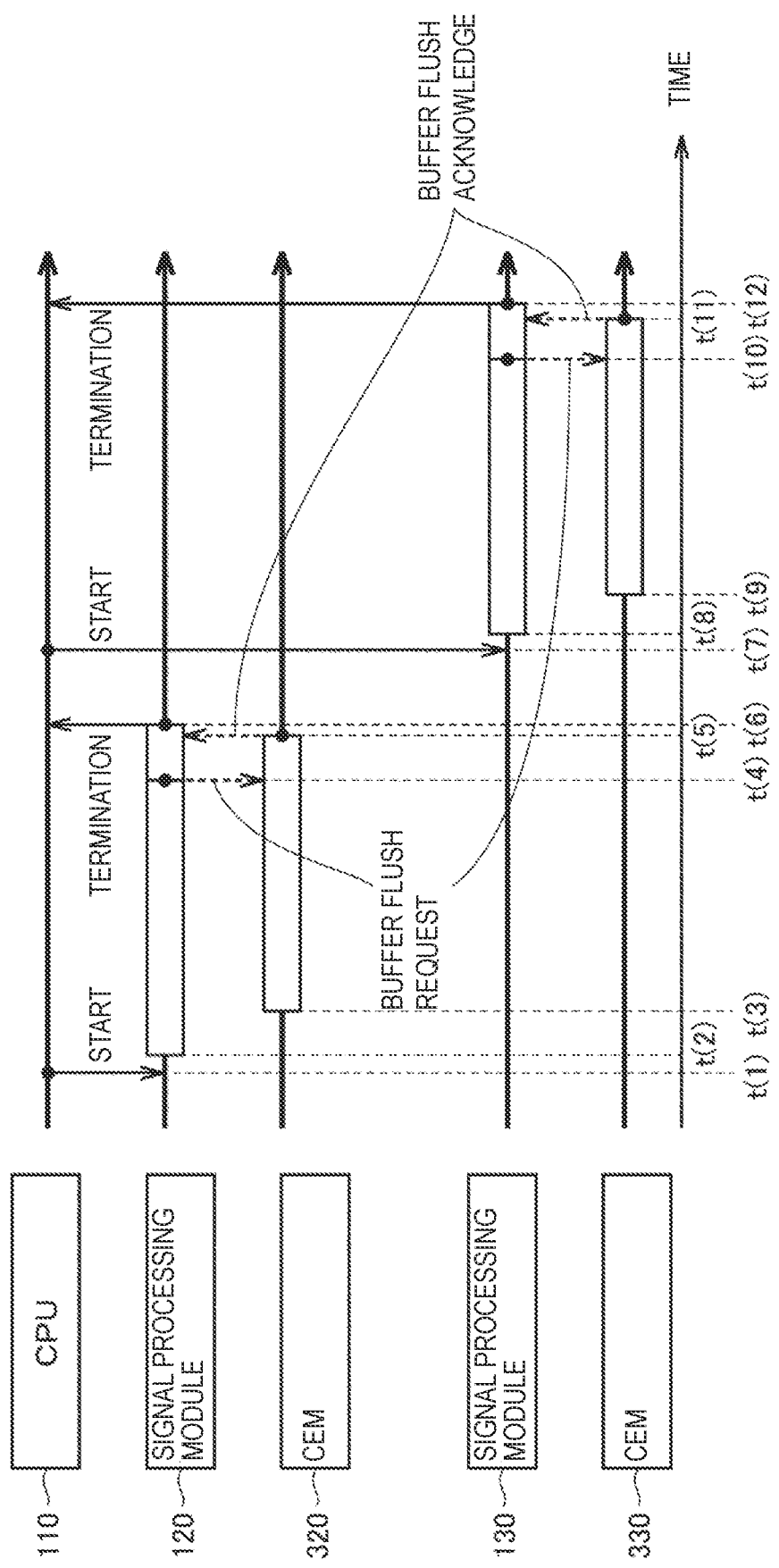
FIG. 4 shows a flow chart describing the timing of controls implemented to achieve consistency in the two signal processing modules in other aspects.

Referring now to FIGS. 3 and 4, a configuration of the semiconductor device 300 according to an aspect will be described. FIG. 3 shows a block diagram describing the hardware structure of the semiconductor device 300. FIG. 4 shows a flow chart describing the timing of controls implemented to achieve consistency in the two signal processing modules in other aspects.

As shown in FIG. 3, the semiconductor device 300 includes a CPU110, signal processing modules 120 and 130, a CEM320 330, a memory controller 140, and a memory 150. The CEM320 includes buffers 321. The CEM330 includes buffers 331. The CPU110, the CEM320 330, and the memory controller 140 are connected to the buses 160. The memory 150 is connected to the memory controller 140. The CEM320 is connected to the signal processing modules 120. The CEM330 is connected to the signal processing modules 130.

As shown in FIG. 4, at time t(1), the CPU110 transmits an instruction to execute processing to the signal processing module 120. In response to the execution instruction, the signal processing module 120 starts execution of processing at timing t(2). From time t(3), the processed data is stored in the CEM320 buffer 321. Once a certain processing unit has been completed, the signal processing module 120 sends an instruction to output the data stored in the buffer (hereinafter also referred to as "buffer flush request") to the CEM320 at time t(4). In response to the buffer flush request, the CEM320 outputs the data stored in the buffer 321 to the external memory 150. At time t(5), the CEM320 transmits a notification (buffer flush acknowledge) indicating that all data stored in the buffer 321 has been stored in the memory 150 to the signal processing module 120. When the signal processing module 120 receives the notification, at time t(6), it outputs the end interruption to the CPU110.

Thereafter, at time t(7), the CPU110 transmits an instruction to execute processing to the signal processing module 130. In response to the execution instruction, the signal processing module 130 starts execution of processing at timing t(8). From time t(9), the processed data is stored to buffer 331 in the CEM330. Once a processing unit is completed, the signal processing module 130 sends a buffer flash request to the CEM330 at time t(10). In response to the buffer flush request, the CEM330 outputs the data stored in the buffer 331 to the external memory 150. At time t(11), the CEM330 transmits a notification (buffer flush acknowledge) indicating that all data stored in the buffer 331 has been stored in the memory 150 to the signal processing module 130. When the signal processing module 130 receives the notification, at time t (12), it outputs the end break to the CPU110.

Figure 5:
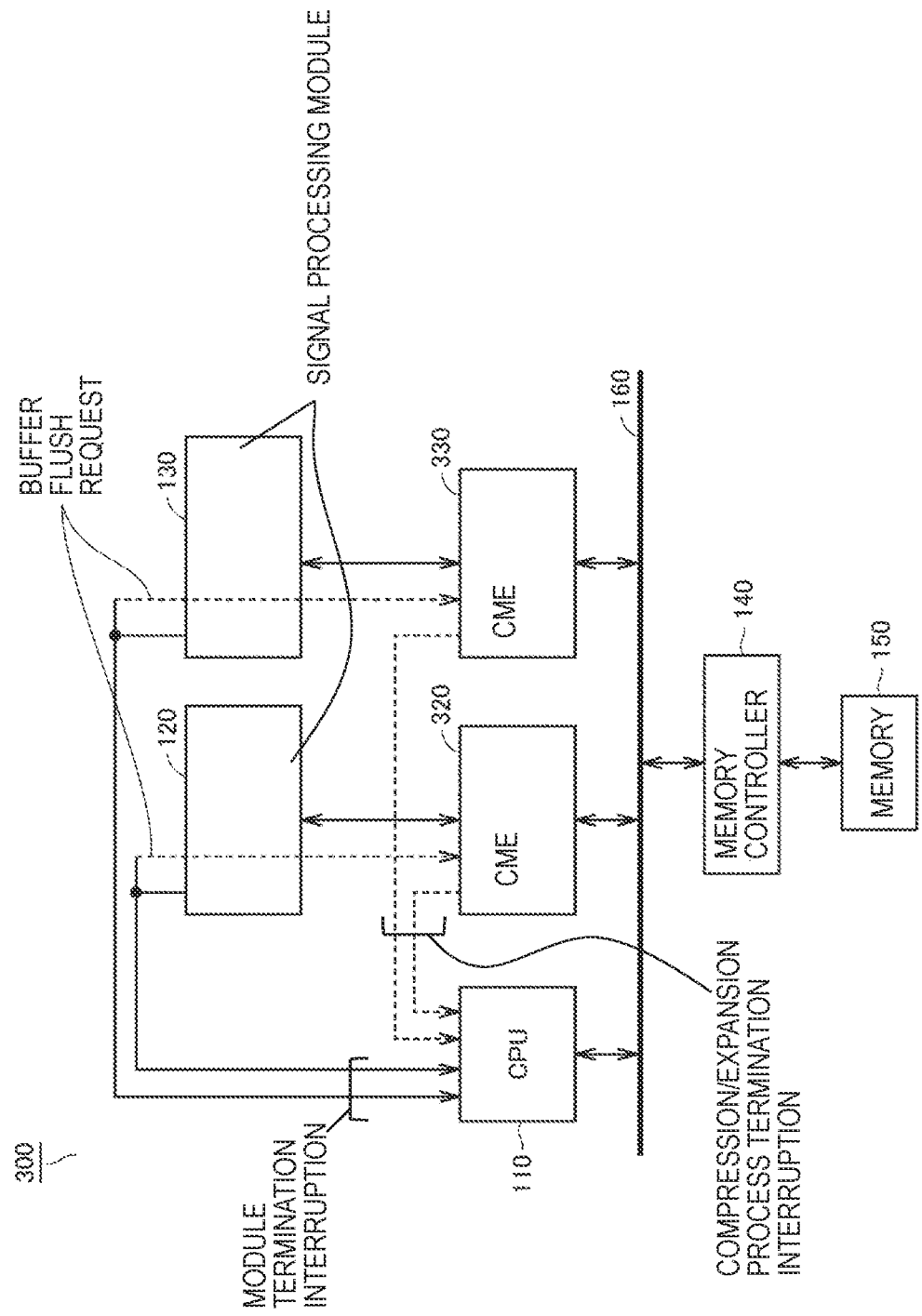
FIG. 5 shows other control structures of the semiconductor device 300.
Figure 6:
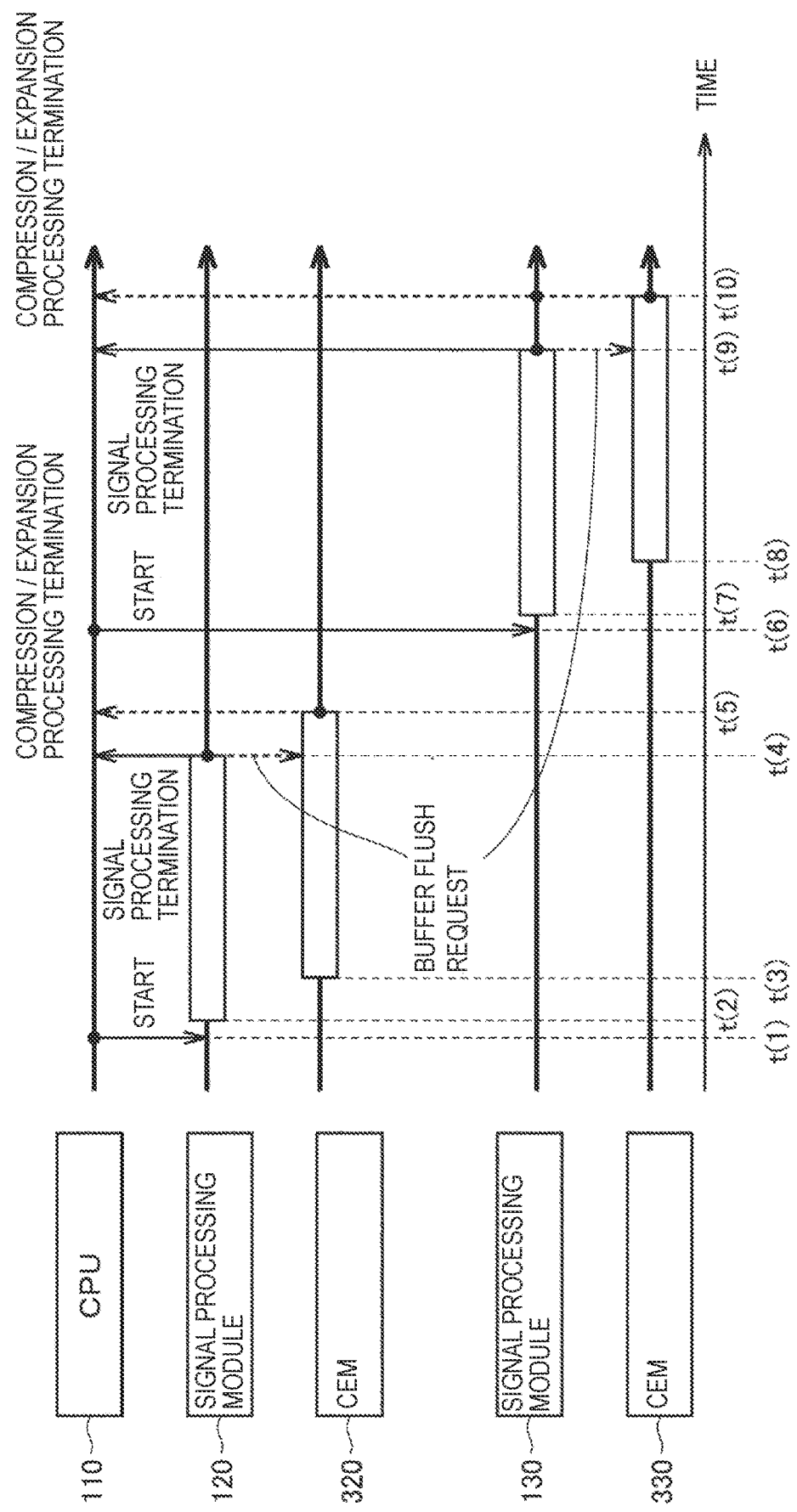
FIG. 6 shows a timing chart describing when other operations of the semiconductor device 300 are executed.

Referring to FIGS. 5 and 6, other control structures of semiconductor device 300 in accordance with certain aspects are described. FIG. 5 shows other control structures of the semiconductor device 300. FIG. 6 shows a timing chart describing when other operations of the semiconductor device 300 are executed.

As shown in FIG. 5, in the semiconductor device 300, when a module termination interruption from the signal processing module 120 or 130 is outputted to the CPU110, the signal processing module 120 or 130 outputs a buffer flush request as an instruction for pushing the memory 150 from the buffer 321 or 331 in the CEM320 or 330. When all the data stored in the buffers 321 and 331 are stored in the memory 150, the CEM320 330 outputs a compression/expansion process termination interrupt to the CPU110.

Referring to FIG. 6, at time t(1), the CPU110 transmits an instruction to execute processing to the signal processing module 120. In response to the execution instruction, the signal processing module 120 starts execution of processing at timing t(2). From time t(3), the processed data is stored to buffer 321 in the CEM320. Once a certain processing unit is completed, the signal processing module 120 outputs the module termination interruption to the CPU110 at time t(4), and also sends a buffer flush request to the CEM320. In response to the buffer flush request, the CEM320 outputs the data stored in the buffer 321 to the external memory 150. At time t(5), the CEM320 transmits a compression/expansion process termination interruption to the CPU110 as a notification (buffer flush acknowledge) indicating that all data stored in the buffer 321 has been stored in the memory 150.

Thereafter, at time t(6), the CPU110 transmits an instruction to execute processing to the signal processing module 130. In response to the execution instruction, the signal processing module 130 starts execution of processing at timing t(7). From time t(8), the processed data is stored to buffer 331 in the CEM330. Once a certain processing unit is completed, the signal processing module 130 outputs the module termination interruption to the CPU110 at time t(9), and also sends a buffer flush request to the CEM330. In response to the buffer flush request, the CEM330 outputs the data stored in the buffer 331 to the external memory 150. At time t(10), the CEM330 transmits a compression/expansion process termination interruption to the CPU110 as a notification (buffer flush acknowledge) indicating that all data stored in the buffer 331 has been stored in the memory 150.

A technique for realizing data consistency even when the end of processing is not clear will be described with reference to FIG. 7. In this technique, data consistency can be realized by automatically and exclusively controlling accesses to the shared memory without changing the configuration of the signal processing modules or adding software control by a CPU110 or the like even if compression/expansion processing is applied to the shared memory.

Figure 7:
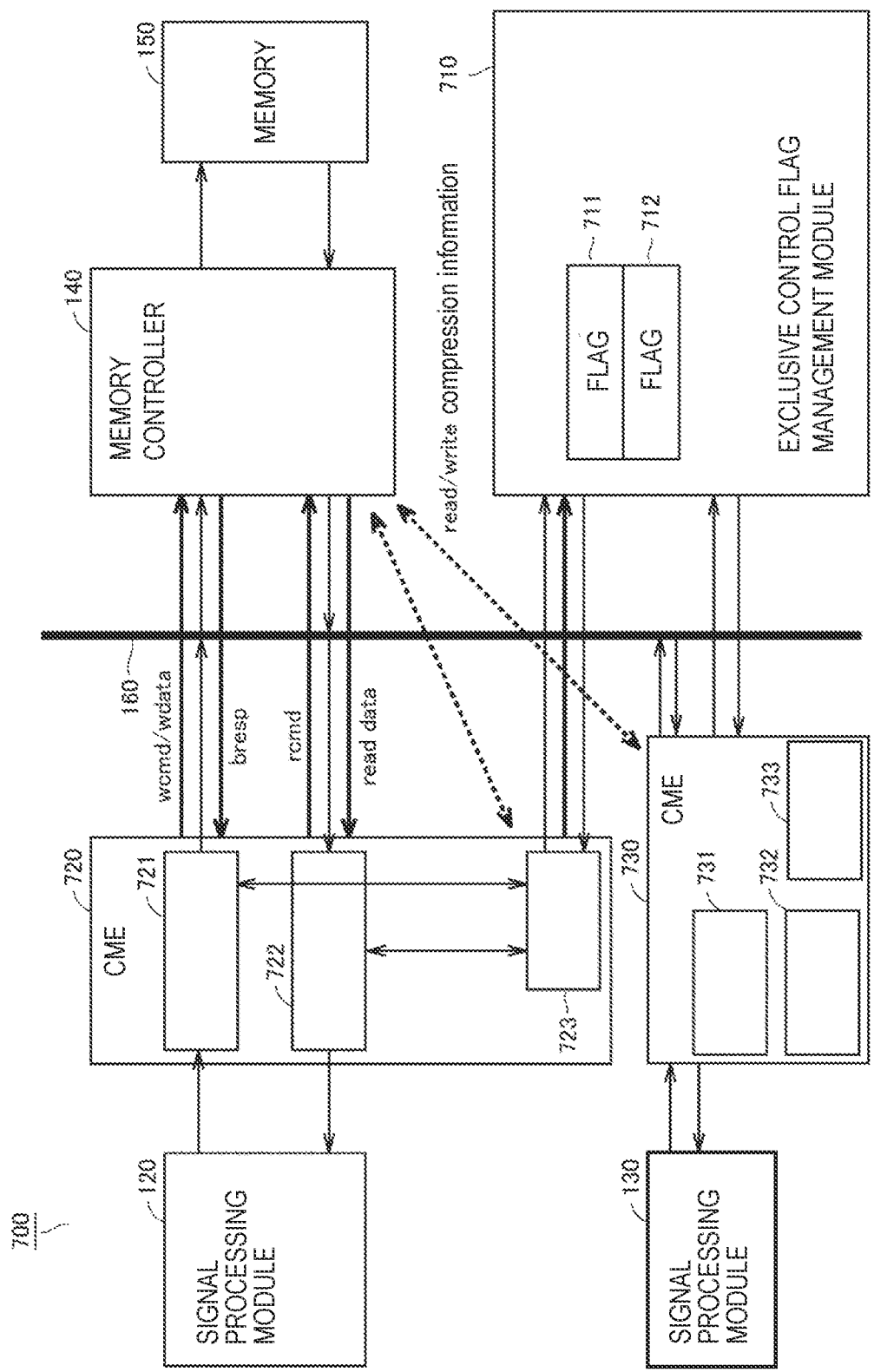
FIG. 7 shows a diagram describing the hardware structure of the semiconductor device 700 in accordance with an embodiment.

FIG. 7 shows a diagram describing the hardware structure of the semiconductor device 700 in accordance with an embodiment.

Semiconductor device 700 includes a signal processing module 120,130, a memory controller 140, a memory 150, an exclusive control flag management module 710, and a compression/expansion module (CEM) 720,730. The signal processing module 120 and the signal processing module 130 are configured to communicate with each other, and in some aspects, either signal processing module is configured to use data processed by other signal processing module.

The memory 150 is, for example, a DDR SDRAM (Double-Data-Rate Synchronous Dynamic Random Access Memory, but may be another memory.

The compression/expansion modules 720 and 730 and the memory controller 140 are connected to the bus 160, respectively. The exclusive control flag management module 710 is connected to the compression/expansion modules 720 and 730. The compression/expansion module 720 is further connected to the signal processing module 120. The compression/expansion module 730 is further connected to the signal processing module 130.

In one aspect, the signal processing module 120, 130 directs lossless compression of data for a transaction. The signal processing modules 120 and 130 are implemented by a combination of software and hardware as an arithmetic processing device such as CPUs for executing instructions. In other aspects, the signal processing modules 120 and 130 may also be configured as ASIC (Application Specific Integrated Circuit) or other hardware.

In an aspect, the exclusive control flag management module 710 may be implemented as a combination of a plurality of circuit elements configured to perform arithmetic processing for managing writing of compressed data and compressed information to the memory 150 and reading of compressed data and compressed information from the memory 150. In another aspect, the exclusive control flag management module 710 may be configured by a processor that executes the arithmetic processing.

In one aspect, the compression/expansion module 720 is implemented as a circuit configured to perform a process of losslessly compressing data output by the signal processing module 120 to generate compressed data, and a process of losslessly expanding the compressed data to decompress the uncompressed data. In another aspect, the compression/expansion module 720 may be implemented as combinations of instructions for implementing these processes and an arithmetic device for executing the instructions. The same applies to the compression/expansion module 730. In addition, although FIG. 7 shows the pattern in which two reduction and expansion modules are used, in another phase more than three reduction and expansion modules may be used.

The compression/expansion module 720 includes a lossless compression processing unit 721, a lossless expansion processing unit 722, and a compression information management unit 723. The compression/expansion module 730 includes a lossless compression processing unit 731, a lossless expansion processing unit 732, and a compression information management unit 733.

The lossless compression processing unit 721 performs data compression processing on the transaction of the signal processing module 120, and generates compressed data and compressed information. The compression information indicates the data amount of the compressed data. The compressed data and the compressed information are stored in the memory 150 by the memory controller 140. For example, when confirming that data can be written to the memory 150, the lossless compression processing unit 721 sends the write command (wcmd) and the compressed data (wdata) to be written to the memory controller 140.

On the other hand, when the compression/expansion module 720 receives a read command from the signal processing module 120, the lossless expansion module 722 sends a read command (rcmd) to the memory controller 140. The memory controller 140 reads compressed data from the memory 150 in response to the read commands, and sends the read compressed data (read data) to the compression/ expansion module 720. The lossless expansion processing unit 722 performs expansion processing on the compressed data, and transmits the decompressed data to the signal processing module 120. The signal processing module 120 performs predetermined processing using the decompressed data.

The compression information management unit 723 is configured to be able to communicate with the lossless compression processing unit 721, the lossless expansion processing unit 722, and the memory controller 140. Further, the compressed information management unit 723 is configured to be able to communicate with the exclusive control flag management module 710. In one aspect, the compression information management unit 723 communicates compression information with the memory controller 140. In another aspect, the compressed information management unit 723 requests locking of the address space based on the first access to the address space.

The lossless compression processing unit 731 executes the same processing as the lossless compression processing unit 721. More specifically, the lossless compression processing unit 731 performs the lossless compression processing of the data on the transaction of the signal processing module 130. If the result of the check of the exclusive control indicates that the data can be written to the memory 150, the compression/expansion module 730 transmits the write command (wcmd) and the compressed data to be written to the memory controller 140, and the compressed data is stored in the memory 150 by the memory controller 140.

On the other hand, when the compression/expansion module 730 receives an instruction from the signal processing module 130, the compression/expansion module 730 confirms that the memory 150 is accessible. When the memory controller 140 reads the compressed data from the memory 150 to the compression/expansion module 730, the lossless expansion processing unit 732 performs expansion processing on the data. The compressed information management unit 733 is configured to be able to communicate with the exclusive control flag management module 710. The compression information management unit 733 communicates compression information with the memory controller 140.

In one embodiment, the size of the address space subject to exclusive control is defined based on a unit of compression processing for generating compressed data and compression information. For example, in one aspect, exclusive control of accesses to memory regions shared in memory 150 may be managed in units of data sizes managed by compression/expansion modules 720 and 730. As an example, when the unit of compression processing is 256 bytes and the unit of management of compression information is 64, the exclusive control is executed in units of 16 k (=256×64=16,384) bytes. With such a configuration, the buffer can be pushed out data even when the end of the processing at the timing of pushing out the data from the buffer is not clear. The exclusive control is performed between the compressed information management unit 723 and the exclusive control flag management module 710.

The exclusive control flag management module 710 manages the flag for exclusive control. In one aspect, the exclusive control flag management module 710 includes flags 711 and 712. In one aspect, the flags are provided as many as the number of compression/expansion modules. In the example shown in FIG. 7, since two compression/expansion modules are illustrated, two flags are provided in the exclusive control flag management module 710, but in another aspect, three or more compression/expansion modules and flags may be used. As an example, the flags 711 and 712 respectively indicate whether or not a memory space for storing compressed data is allocated to any one of a plurality of signal processing modules. More specifically, in one aspect, the top address of the area to be locked in the memory 150 is used as the flags 711 and 712. The head address is transmitted to the exclusive control flag management module 710 by the compression information management units 723 and 733, and is stored in an area secured in the exclusive control flag management module 710.

In one aspect, when the first access to the 16 kbyte space in the memory 150 is performed by the lossless compression processing unit 721, information indicating the access is sent to the compression information management unit 723. In response to the reception of the information, the compressed information management unit 723 requests the exclusive control flag management module 710 to lock the space. The exclusive control flag management module 710 attempts to lock the space, and returns information indicating whether or not the space has been locked to the compressed information management unit 723. When the exclusive control flag management module 710 cannot lock the space, a retry for requesting the exclusive control flag management module 710 to lock the space again is executed. The frequency of the retries can be appropriately set by the manufacturer of the semiconductor device 700.

In one aspect, when the compression/expansion module 720 attempts to write access to the memory 150, the compression/expansion module 720 releases the lock of the 16 kbyte space when all of the compression data and compression information for the 16 kbyte space that the compression/expansion module 720 has is stored in the memory 150. When the compression/expansion module 720 releases the lock of the space, the content of the flag of the exclusive control flag management module 710 is updated to that effect.

In another aspect, when a read access is performed, the compression/expansion module 720 releases the lock of the 16 kbyte space when the compression information for the 16 kbyte space temporarily held by the compression/expansion module 720 is overwritten by the compression information read from the compression information management unit 723.

When there is no access to the locked 16 kbyte space from the signal processing module 120 for a predetermined time, the compression/expansion module 720 pushes all data and compression information for the corresponding 16 kbyte space to the memory 150 and releases the lock of the space at the time of the write access.

On the other hand, at the time of a read access, the compression/expansion module 720 invalidates the compression information for the corresponding 16-kbyte space, and releases the locking of the space.

Figure 8:
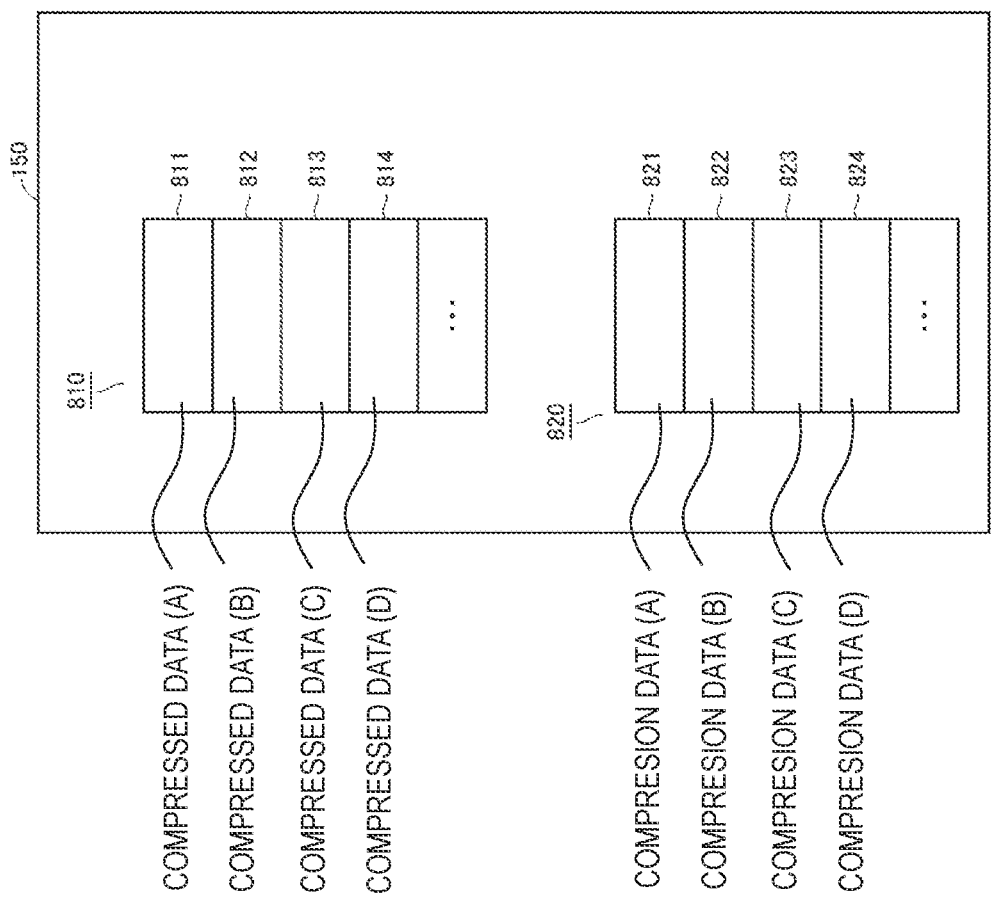
FIG. 8 shows a diagram describing an example of data stored in the memory 150 in a certain situation.

Next, referring to FIG. 8, one mode of storing data in the memory 150 according to the present embodiment will be described. FIG. 8 shows a diagram describing an example of data stored in the memory 150 in a certain situation.

At a certain time, the memory 150 includes areas 811 to 814 and 821 to 824, the size of each area is predetermined. Compressed data 810 and compression information 820 are stored. The compressed data 810 includes compressed data (A), compressed data (B), compressed data (C), compressed data (D), and the like. The compression information 820 includes compression information (A), compression information (B), compression information (C), and compression information (D).

The compressed data 810 is data generated by compression processing by the lossless compression processing unit 721 or the lossless compression processing unit 731. The compression information 820 includes a data amount of the compressed data 810. For example, the compression information (A) indicates the data amount of the compressed data (A). The same applies to the compression information (B), the compression information (C), and the compression information (D).

For example, when the lossless compression processing unit 721 compresses the data generated by the processing by the signal processing module 120 and writes the data as compressed data (A) in the region 811, first, the compression/expansion module 720 accesses the exclusive control flag management module 710 via the compression information management unit 723.

As an example, the lossless compression processing unit 721 accesses the exclusive control flag management module 710 via the compression information management unit 723 and checks the content of the exclusive control management flag. Since the memory space in the memory 150 is not dedicated to any signal processing module in the first aspect of writing compressed data, the exclusive control management flag (e.g., flag 711) indicates that the memory space (e.g., region 811) is not dedicated to any signal processing module.

Therefore, the compression information management unit 723 rewrites the content of the flag 711 to the top address of the region 811 to be secured, and transmits the content of the flag (the top address of the area 811) to the lossless compression processing unit 721. Upon receiving the content, the lossless compression processor 721 sends an instruction (e.g., wcmd) for writing the compressed data (A) in the region 811 and for writing the compression information (A) in the area 821, the compressed data (A) and the compression information (A) to the memory controller 140.

The memory controller 140 writes the compressed data (A) in the region 811 and the compression information (A) in the area 821 based on the instruction. When the writing of the compressed data (A) and the compression information (A) is completed, the memory controller 140 sends a signal indicating the completion of the writing to the lossless compression processing unit 721.

When the lossless compression processing unit 721 receives the signal, the compression information management unit 723 is notified that the region 811 has been released from the exclusive possession of the signal processing module 120. The compressed information management unit 723 clears the content of the flag 711 to indicate that the region 811 is not exclusively allocated to any signal processing module. Therefore, after that, other signal processing module, for example, the signal processing module 130, can access the region 811, and, for example, can read the compressed data stored in the area 811.

Next, in the case of a read access, when the compression information for the 16-kbyte space temporarily held by the compression/expansion module 730 is overwritten with the newly read compression information, the compression information management unit 723 releases the lock of the 16-kbyte space.

More specifically, as an example, when the signal processing module 130 attempts to perform an operation using data stored in the memory 150, it instructs the compression/expansion module 730 to read the compressed data from the memory 150. In the compression/expansion module 730, the compression information management unit 733 accesses the exclusive control flag management module 710 and checks whether or not access to the compressed data to be read is possible. For example, when the signal processing module 130 attempts to use the compressed data (A) stored in the region 811, the compression information management unit 733 checks the contents of all the flags included in the exclusive control flag management module 710. In the configuration example of FIG. 7, the Compression Information Management Unit 733 verifies the content of flags 711 and 712. When the contents of the flags 711 and 712 indicate that the region 811 is not dedicated to any signal processing module (for example, the top address of the area 811 is not written in any of the flags 711 and 712), the compression information management unit 733 transmits to the exclusive control flag management module 710 an instruction for changing the contents of the area 811 to the contents indicating that the area 811 is dedicated by the signal processing module 130. The exclusive control flag management module 710 changes the contents of the flag 711 or the flag 712 in accordance with the instruction. For example, the exclusive control flag management module 710 writes the top address of the region 811 in the flag 712.

When the change of the content of the flag 712 is completed, the exclusive control flag management module 710 sends a notification indicating that the change is completed to the compression/expansion module 730. In response to the reception of the notification, the lossless expansion processing unit 732 accesses the memory 150 via the memory controller 140. The memory controller 140 reads the compressed data (A) stored in the region 811 and the compression information (A) stored in the area 821, and transmits the compressed data (A) and the compression information (A) to the compression/expansion module 730. The lossless expansion processing unit 732 expands the compressed data (A) using the read compression information (A), and sends the original data to the signal processing module 130. The signal processing module 130 performs processing using the data.

As described above, according to the semiconductor device 700 according to the first embodiment, even if the data is compressed, the consistency of the data can be realized without changing the function of the signal processing module such as the signal processing module or adding the control of the software executed by the processor that controls the signal processing module. Also, data consistency can be achieved even if there is no explicit start or end of data processing in the signal processing module. For example, even when processing is performed in a case where the processing unit of the signal processing module is not clear, that is, even when the end of the processing at the timing of pushing out data from the buffer is not clear, since the processing unit is defined by a predetermined data size, it is possible to perform pushing out data from the buffer.

Figure 9:
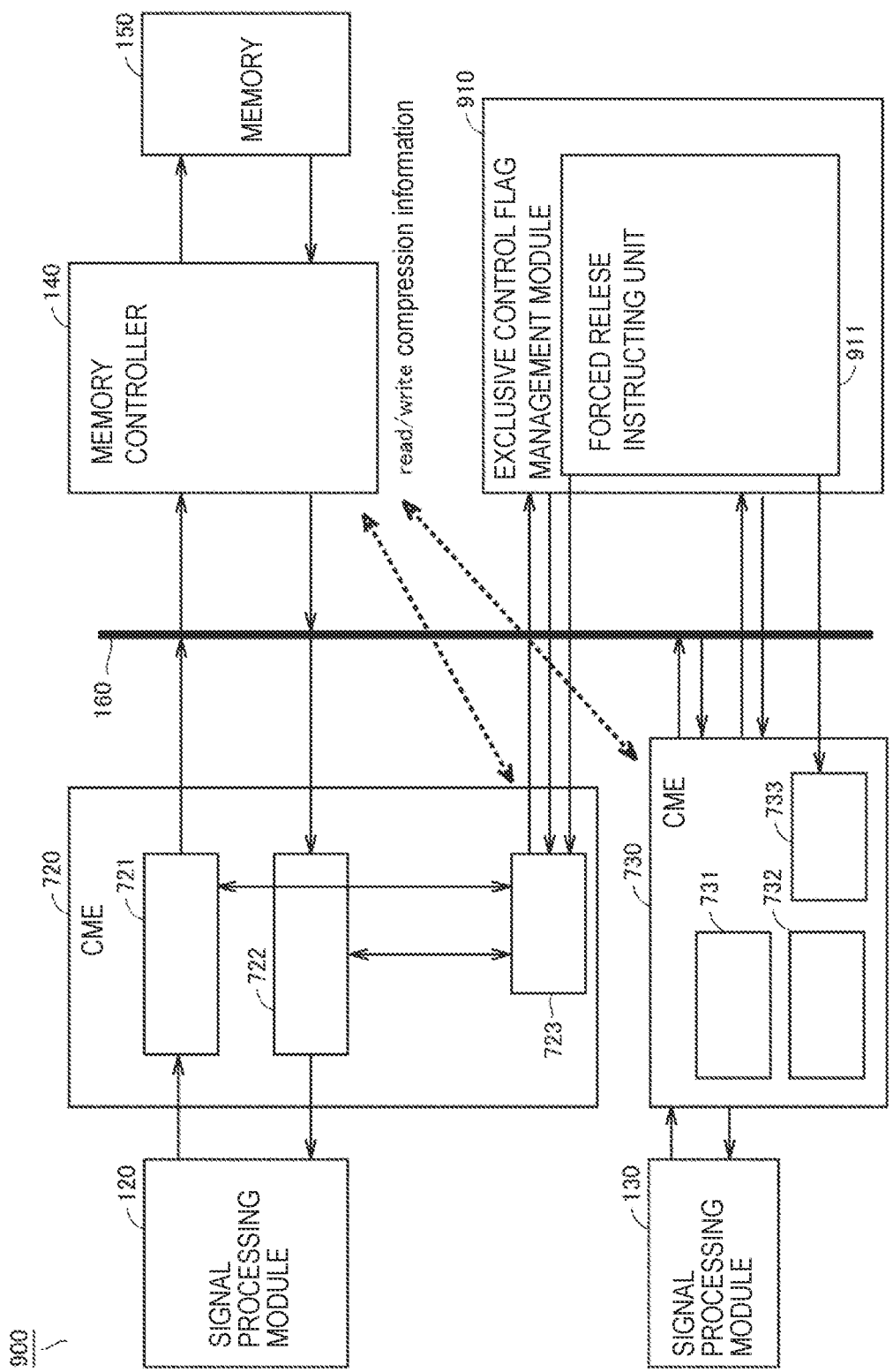
FIG. 9 shows a diagram describing the hardware structure of the semiconductor device 900 according to the second embodiment.

A second embodiment will be described with reference to FIG. 9. FIG. 9 shows a diagram describing the hardware structure of the semiconductor device 900 according to the second embodiment. The semiconductor device 900 according to the present embodiment differs from the semiconductor device 700 described above in that it has a function of forcibly releasing an address space for a compression/expansion module exclusively possessing the address space.

The semiconductor device 900 includes an exclusive control flag management module 910 instead of the exclusive control flag management module 710 included in the semiconductor device 700. The exclusive control flag managing module 910 includes a forced release instructing unit 911 in addition to flags (e.g., flags 711 and 712) held by the semiconductor device 700. The rest of the configuration is the same as that of the semiconductor device 700. The same components are denoted by the same reference numerals. Therefore, description of the same configuration will not be repeated.

The forced release instructing unit 911 is connected to each of the compression/expansion modules 720 and 730, and instructs the compression/expansion module that occupies a certain address space of the memory 150 to release the address space.

In one aspect, when an attempt of a lock the address space by a signal processing module fails a set number of times, the exclusive control flag management module 910 outputs an instruction to the compression/expansion module locking the address space to forcibly release the address space. The set number of times can be appropriately set for each of the signal processing modules by the manufacturer of the semiconductor device 900. The compression/expansion module that has received the instruction to release the address space immediately releases the address space.

For example, when a write access is performed, the compression/expansion module that has received the release instruction writes all the compressed data and compression information for the 16 kbyte space corresponding to the address space into the memory 150, and when the writing is completed, releases the lock of the 16 kbyte space.

On the other hand, when the read access is performed, the compression/expansion module that has received the release instruction invalidates the compression information for the 16 kbyte space corresponding to the address space, and releases the lock of the space.

As described above, the semiconductor device 900 according to the present embodiment can prioritize the exclusive use of the address space for each of the signal processing modules. This makes it possible to individually set, for example, a signal processing module requiring immediate response is provided with high priority, and a signal processing module having high robustness is provided with low priority. As a result, it is possible to provide the semiconductor device 900 having operation characteristics according to the application.

A third embodiment will be described below. The semiconductor device 1000 according to the present embodiment differs from the semiconductor device 700 and the semiconductor device 900 according to the above-described embodiment in that a lossless compression unit, a lossless expansion unit, and an exclusive control flag managing module are mounted on a memory controller. Note that the same reference numerals are assigned to the same components as those included in the semiconductor device according to the above-described embodiment. These functions are the same. Therefore, description of the same configuration will not be repeated.

Figure 10:
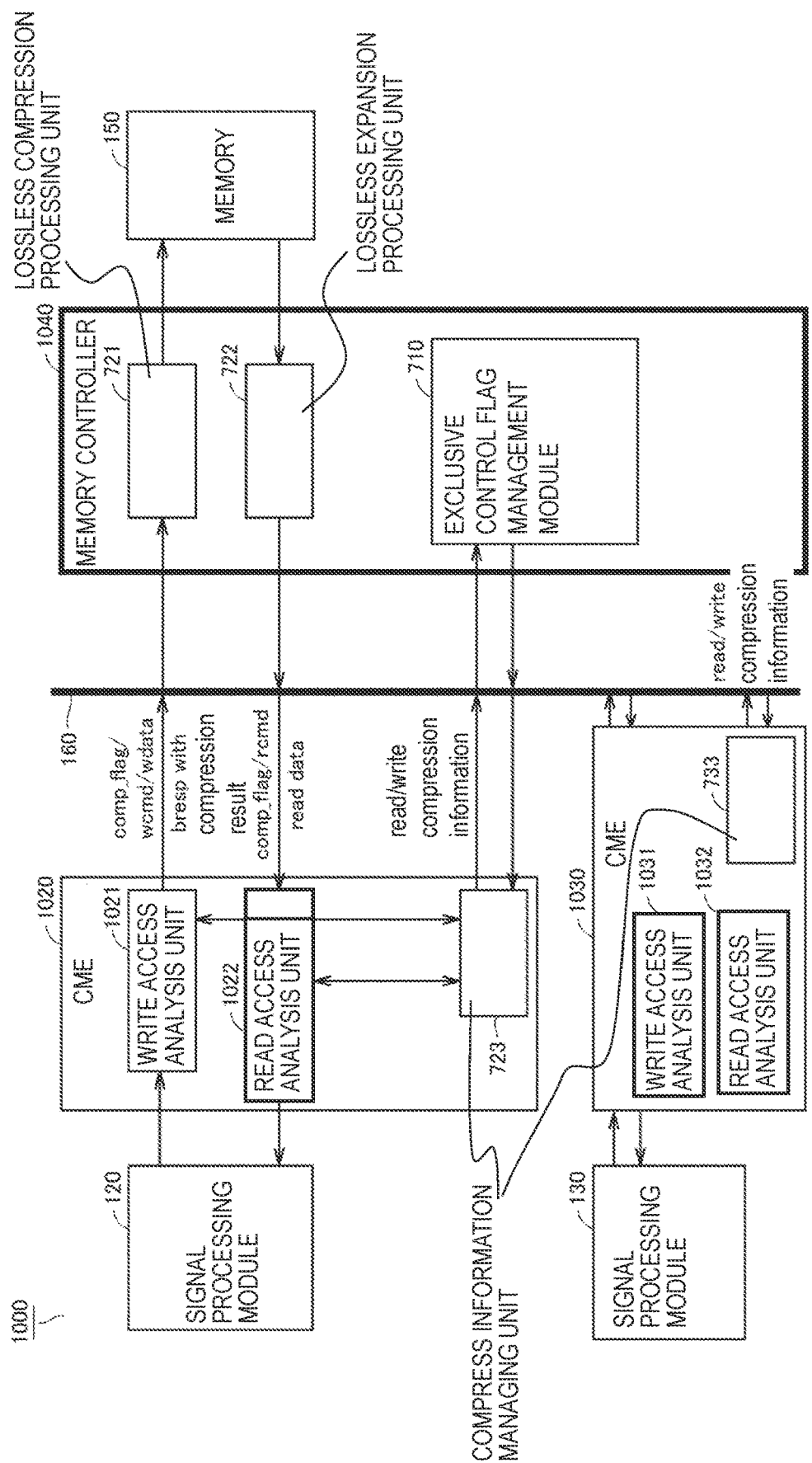
FIG. 10 shows a diagram describing the hardware structure of the semiconductor device 1000 in accordance with an embodiment.

Referring to FIG. 10, the configuration of the semiconductor device 1000 will be described. FIG. 10 shows a diagram describing the hardware structure of the semiconductor device 1000 in accordance with an embodiment. The semiconductor device 1000 includes signal processing modules 120 and 130, compression/expansion modules 1020 and 1030, a memory controller 1040 and a memory 150. The compression/expansion module 1020 includes a write access analysis unit 1021, a read access analysis unit 1022 and a compression information management unit 723. The compression/expansion module 1030 includes a write access analysis unit 1031, a read access analysis unit 1032 and a compression information management unit 733. The memory controller 1040 includes a lossless compression processing unit 721, a lossless expansion processing unit 722, and an exclusive control flag management module 710. Also in present embodiment, the sizes of the address spaces to be subjected to exclusive control are defined on the basis of units of compression processes for generating compressed data and compression information. Therefore, even if the lossless compression method is used and the amount of compressed data is variable, data consistency can be ensured.

The write access analysis unit 1021 analyzes the transaction of the signal processing module 120, and based on the result of the analysis and the data from the compression information management unit 723, determines whether or not the compression processing for writing to the memory 150 can be executed. When the result of the write access analysis unit 1021 indicates that the compression processing can be executed, the compression/expansion module 1020 sends the data to be compressed and an instruction to execute the compression processing to the memory controller 1040. In response to the instruction, the lossless compression processing unit 721 performs compression processing on the data, and stores the compressed data and the compression information in a predetermined area.

On the other hand, the read access analysis unit 1022 analyzes the transaction of the signal processing module 120, and based on the result of the analysis and the data from the compression information management unit 723, determines whether or not the expansion processing of the compressed data stored in the memory 150 can be executed. When the result of the read access analysis unit 1022 indicates that the expansion processing can be executed, the compression/expansion module 1020 specifies an area in which the compressed data to be expanded is stored, and sends an instruction for reading the compressed data from the memory 150 to the lossless expansion processing unit 722. In response to the instruction, the lossless expansion processing unit 722 accesses the specified area, performs expansion processing on the compressed data, and sends the expanded data to the read access analysis unit 1022. The read access analysis unit 1022 sends the expanded data to the signal processing module 120.

Although one embodiment of the compression/expansion processing executed by the signal processing module 120 has been illustrated, the same applies to the case where the signal processing module 130 executes the compression/expansion processing.

As described above, according to the semiconductor device 1000 according to the present embodiment, the exclusive control flag managing module 710, the lossless compression unit 721, and the lossless expansion unit 722 are mounted on the memory controller 1040. With such a configuration, the lossless compression unit 721 and the lossless expansion unit 722, which are large in scale (large in occupied area), are grouped together in one place, so that the entire scale (size) of the semiconductor device 1000 can be suppressed. In addition, since the memory controller 1040 includes the exclusive control flag management module 710, the memory controller 1040 can manage transactions of all the signal processing modules, so that data consistency among all the signal processing modules can be realized.

The fourth embodiment will be described below. The semiconductor device 1100 according to the present embodiment differs from the semiconductor device 1000 according to the third embodiment in that it has a function of forcibly releasing an address space.

Figure 11:
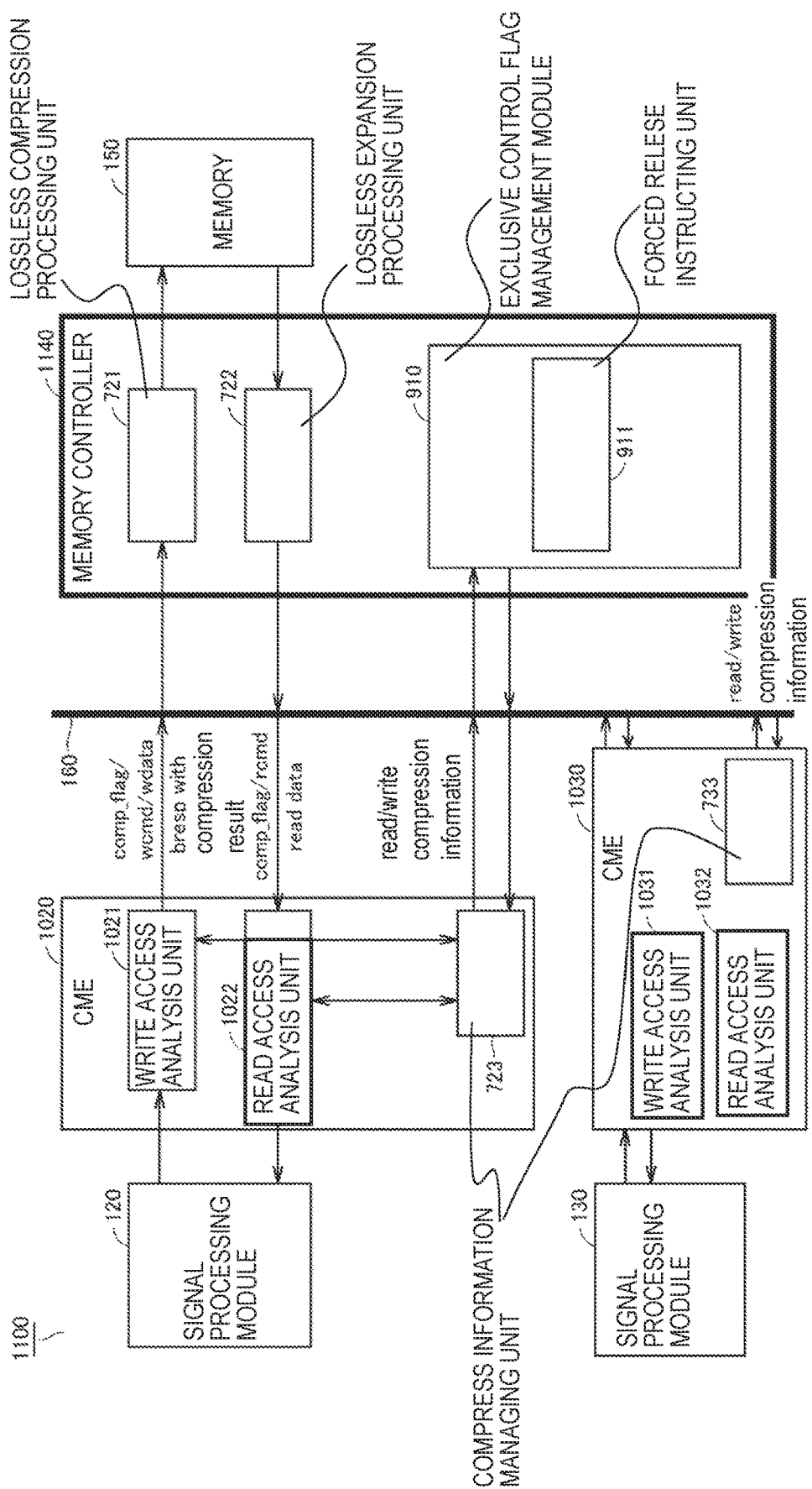
FIG. 11 shows a diagram describing the hardware structure of the semiconductor device 1100.

Referring to FIG. 11, a configuration of a semiconductor device 1100 according to a fourth embodiment will be described. FIG. 11 shows a diagram describing the hardware structure of the semiconductor device 1100. The same components as those described above are denoted by the same reference numerals. The function of this configuration is also the same. Therefore, description of the same configuration will not be repeated.

The semiconductor device 1100 includes a memory controller 1140 instead of the memory controller 1040 in the configuration of the semiconductor device 1000 shown in FIG. 10. The memory controller 1040 includes a lossless compression unit 721, a lossless expansion unit 722 and an exclusive control flag management module 910. The exclusive control flag management module 910 includes a forced release instructing unit 911 in addition to flags (e.g., flags 711, 712, 713, and 714) held by the semiconductor device 700.

According to the semiconductor device 1100 shown in FIG. 11, similarly to the semiconductor device 900 according to the second embodiment, when an attempt of a lock an address space fails a predetermined number of times in the memory 150, the compression/expansion module occupying the address space can be instructed to release the address space. When the address space is released in response to the instruction, the compression/expansion module requesting the lock of the address space can perform the lock. In this manner, priority can be assigned to each signal processing module with respect to the exclusive use of the address space.

Figure 12:
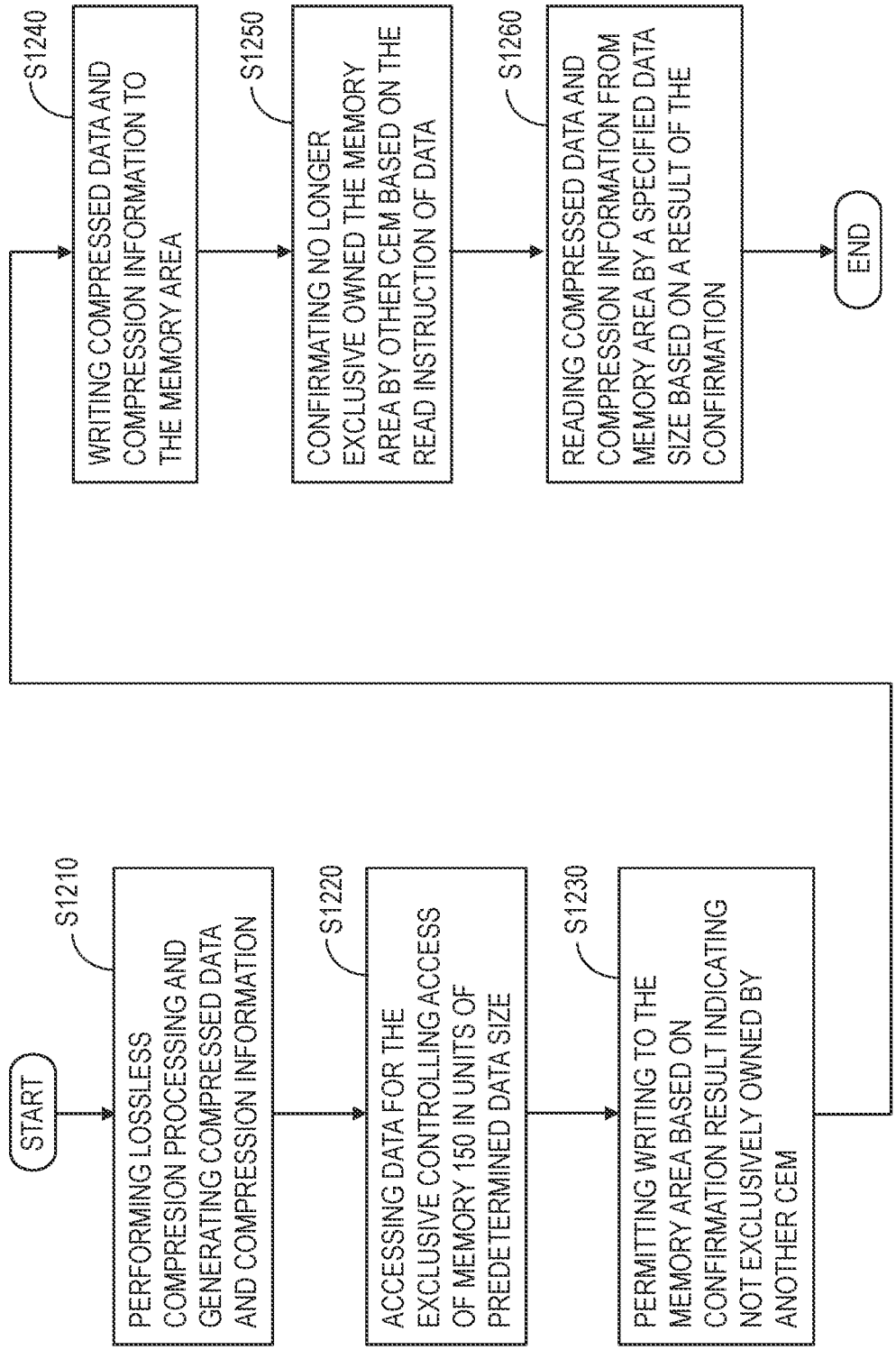
FIG. 12 shows a flow chart describing part of the process performed in semiconductor device 700 in accordance with an embodiment.

Referring to FIG. 12, an outline of the control structure of the semiconductor device described in detail above will be described. FIG. 12 shows a flow chart describing part of the process performed in semiconductor device 700 in accordance with an embodiment. The same applies to other semiconductor device 900, 1000, 1100.

In step S1210, the lossless compression processing unit 721 of the compression/expansion module 720 compresses the data received from the signal processing module 120, and generates compressed data and compression information representing the data amount of the compressed data.

In step S1220, the lossless compression processor 721 accesses the management information (e.g., flags 711 and 712) for controlling the writing of the compressed data to the memories 150 in units of predetermined data sizes via the compression data management unit 723.

In step S1230, when write access to the memory 150 is performed, the compression data management unit 723 permits writing to the memory area in a predetermined data size unit based on the fact that the management data (any flag) indicates that the area accessed by the write access is not exclusively owned by another compression/expansion module (for example, the compression/expansion module 730). For example, when the flag of the exclusive control flag management module 710 indicates that the top address of the area requesting access is not used by another signal processing module 130, the compression information management unit 723 permits writing by the lossless compression processing unit 721. On the other hand, when the flag of the exclusive control flag management module 710 indicates that the head address is being used by another signal processing module 130, the compression information management unit 723 prohibits writing by the lossless compression processing unit 721.

In step S1240, the lossless compression processing unit 721, upon receiving the permission from the compression information management unit 723, writes the compressed data into the permitted memory area. When detecting the completion of writing, the compression information management unit 723 changes the content of the flag 711 to the content of the compression/expansion module 720 that is no longer exclusive, in order to release the memory area.

Thereafter, in another aspect, a transaction using the compressed data stored in memory 150 may be performed by signal processing module 130. Therefore, the signal processing module 130 transmits a request for compressed data to the compression/expansion module 730.

In the step S1250, when a read access to the memory 150 is performed in response to the request, based on the management data (the above-mentioned flags) indicating that the region to be accessed by the read access is not exclusively owned by other compression/expansion module (for example, the compression/expansion module 720), readings from the area are permitted for the specified data size unit.

In step S1260, the lossless expansion process 732 reads the compressed data and the compressed information from the region based on the read permission. The lossless expansion processing unit 732 performs expansion processing of the compressed data using the compressed information, and expands to the data before compression. The expanded data is transmitted to the signal processing module 130.

Although the invention made by the present inventor has been specifically described based on the embodiment, the present invention is not limited to the embodiment described above, and it is needless to say that various modifications can be made without departing from the gist thereof.

What is claimed is:
1. A semiconductor device comprising:
a compression/expansion module for compressing or expanding data;
a memory for storing the compressed data generated by the compression/expansion module; and
a management module for exclusively controlling access to the memory by the compression/expansion module in a predetermined data size unit,
wherein the compression/expansion module includes:
a lossless compression processing unit for compressing the data and outputting the compressed data and compression information indicating a data amount of the compressed data;
a lossless expansion processing unit for expanding the compressed data and outputting the expanded data before the compressed data; and
a compression information management unit for controlling writing or reading of the compressed data in the memory in units of a defined data size based on data for managing the access, and
wherein the compression information management unit permits writing to an area in units of the defined data size when the management module indicates that the area accessed by a write access is not exclusively owned by another compression/expansion module when the write access to the memory is performed, and permits reading to the area in units of the defined data size when the management module indicates that the area accessed by a read access is not exclusively owned by another compression/expansion module when the read access to the memory is performed.

2. The semiconductor device as claimed in claim 1, wherein a size of an address space for the exclusive control is defined on a basis of a unit of a compression process for generating the compressed data and the compression information.

3. The semiconductor device as claimed in claim 2, wherein said compression information management unit requests locking of the address space based on accesses for the address space.

4. The semiconductor device as claimed in claim 3, wherein requesting the lock includes requesting the lock again until the address space is locked.

5. The semiconductor device as claimed in claim 1, further comprising a forced release instructing unit for instructing the compression/expansion modules occupying an address space in the memory to release the address space.

6. The semiconductor device as claimed in claim 5, wherein the compression/expansion module is connected to a signal processing module, and the forced release instructing unit outputs an instruction to release the address space to another compression/expansion module locking the address space based on a set number of failed attempts by the compression/expansion module to lock the address space.

7. A semiconductor device comprising:
   a compression/expansion module for compressing or expanding data;
   a memory for storing the compressed data generated by the compression/expansion module; and
   a memory controller for controlling storage of data in the memory,
   wherein the compression/expansion module includes a compression information management unit for controlling writing or reading of the compressed data in the memory in units of a predetermined data size based on data for managing access to the memory,
   wherein the memory controller includes:
      a lossless compression unit for compressing data and outputting the compressed data and compression information;
      a lossless expansion processing unit for expanding the compressed data and outputting data before compression; and
      a management module for exclusively controlling access to the memory by the compression/expansion module in a defined data size unit, and
   wherein the compression information management unit permits writing to an area in the defined data size unit when the management module indicates that the area accessed by a write access is not exclusively owned by another compression/expansion module when the write access to the memory is performed, and permits reading to the area in the defined data size unit when the management module indicates that the area accessed by a read access is not exclusively owned by another compression/expansion module when the read access to the memory is performed.

8. The semiconductor device as claimed in claim 7, wherein a size of an address space for the exclusive control is defined on a basis of a unit of a compression process for generating the compressed data and the compression data indicating a data amount of the compressed data.

9. The semiconductor device as claimed in claim 8, wherein the compression information managing unit requests locking of the address space based on first access to the address space.

10. The semiconductor device as claimed in claim 9, wherein requesting a lock includes requesting the lock again until the address space is locked.

11. The semiconductor device as claimed in claim 7, further comprising a forced release instructing unit for instructing the compression/expansion module occupying an address space in the memory to release the address space.

12. The semiconductor device as claimed in claim 11, wherein the compression/expansion module is connected to a signal processing module, and the forced release instructing unit outputs an instruction to release the address space to another compression/expansion module locking the address space based on a set number of failed attempts by the compression/expansion module to lock the address space.

* * * * *